US011260433B2

(12) United States Patent
Takezawa et al.

(10) Patent No.: US 11,260,433 B2
(45) Date of Patent: Mar. 1, 2022

(54) CLEANING METHOD OF SUBSTRATE PROCESSING APPARATUS AND SUBSTRATE PROCESSING APPARATUS (71) Applicant: TOKYO ELECTRON LIMITED, Tokyo (JP)

(72) Inventors: Yoshihiro Takezawa, Nirasaki (JP); Daisuke Suzuki, Nirasaki (JP); Hiroyuki Hayashi, Nirasaki (JP); Sena Fujita, Nirasaki (JP); Tatsuya Miyahara, Nirasaki (JP); Jyunji Ariga, Nirasaki (JP); Shinya Kikuchi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 150 days.

(21) Appl. No.: 16/744,637

(22) Filed: Jan. 16, 2020

(65) Prior Publication Data
US 2020/0230666 A1 Jul. 23, 2020

(30) Foreign Application Priority Data

Jan. 18, 2019 (JP) .............................. JP2019-007270

(51) Int. Cl.
*B08B 9/027* (2006.01)
*B08B 5/00* (2006.01)
*H01L 21/67* (2006.01)

(52) U.S. Cl.
CPC ................ *B08B 9/027* (2013.01); *B08B 5/00* (2013.01); *B08B 2209/027* (2013.01); *H01L 21/67017* (2013.01)

(58) Field of Classification Search
CPC ..... B08B 9/027; B08B 5/00; B08B 2209/027; H01L 21/67017; C23C 16/4405; C23C 16/4408
See application file for complete search history.

(56) References Cited

U.S. PATENT DOCUMENTS

| 2005/0139578 | A1* | 6/2005 | Fukuda | ............... C23C 16/4405 216/67 |
| 2007/0289609 | A1* | 12/2007 | Lim | .................... C23C 16/4405 134/22.1 |
| 2018/0130664 | A1* | 5/2018 | Nakatani | ........... H01L 21/28562 |
| 2018/0187307 | A1* | 7/2018 | Yoshida | ............ C23C 16/45546 |

FOREIGN PATENT DOCUMENTS

JP 2001-284264 A 10/2001

* cited by examiner

*Primary Examiner* — Sharidan Carrillo
(74) *Attorney, Agent, or Firm* — Nath, Goldberg & Meyer; Jerald L. Meyer; Tanya E. Harkins (57) ABSTRACT

There is provided a cleaning method of a substrate processing apparatus comprising cleaning an inside of an exhaust pipe through which a gas of an inside of a processing container is exhausted. The cleaning the inside of the exhaust pipe includes: removing a deposit on a downstream side of an opening/closing valve in the exhaust pipe by supplying a first exhaust pipe cleaning gas containing fluorine to the downstream side of the opening/closing valve in the exhaust pipe in a state in which the opening/closing valve provided in a middle of the exhaust pipe is closed; and removing a deposit on an upstream side of the opening/closing valve in the exhaust pipe by supplying a second exhaust pipe cleaning gas not containing fluorine as a gas constituent element to the inside of the processing container in a state in which the opening/closing valve is opened.

7 Claims, 4 Drawing Sheets

| Step | Cleaning processing container | Cleaning exhaust pipe downstream portion | Purging | Cleaning exhaust pipe upstream portion |
|---|---|---|---|---|
| State of opening/closing valve | Opened state | Closed state | Opened state | Opened state |
| Temperature of processing container | T1 | T1 | T1→T2 (T1<T2) | T2 |
| Temperature of exhaust pipe | T3 | T3 | T3→T4 (T3<T4) | T4 |

CLEANING METHOD OF SUBSTRATE PROCESSING APPARATUS AND SUBSTRATE PROCESSING APPARATUS

CROSS-REFERENCE TO RELATED APPLICATION

This application is based upon and claims the benefit of priority from Japanese Patent Application No. 2019-007270, filed on Jan. 18, 2019, the entire contents of which are incorporated herein by reference.

TECHNICAL FIELD

The present disclosure relates to a cleaning method of a substrate processing apparatus and a substrate processing apparatus.

BACKGROUND

Patent Document 1 discloses a technique of forming a silicon film on a silicon single crystal substrate by disposing a silicon single crystal substrate within a processing container and supplying a mixed gas of chlorosilane gas and hydrogen gas into the processing container. An exhaust pipe for exhausting a gas of an inside of the processing container is connected to the processing container. Residual components of chlorosilane gas are deposited on the exhaust pipe when the silicon film is formed. For example, polychlorinated silane and polychlorinated siloxane are deposited. In Patent Document 1, a mixed gas of chlorine trifluoride gas and nitrogen gas is supplied to the exhaust pipe to remove deposits in the exhaust pipe.

PRIOR ART DOCUMENT

Patent Document

Patent Document 1: Japanese Laid-open Publication No. 2001-284264

SUMMARY

According to one embodiment of the present disclosure, there is provided a cleaning method of a substrate processing apparatus including cleaning an inside of an exhaust pipe through which a gas of an inside of a processing container is exhausted. Cleaning the inside of the exhaust pipe includes: removing a deposit on a downstream side of an opening/closing valve in the exhaust pipe by supplying a first exhaust pipe cleaning gas containing fluorine to the downstream side of the opening/closing valve in the exhaust pipe in a state in which the opening/closing valve provided in a middle of the exhaust pipe is closed; and removing a deposit on an upstream side of the opening/closing valve in the exhaust pipe by supplying a second exhaust pipe cleaning gas not containing fluorine as a gas constituent element to the inside of the processing container in a state in which the opening/closing valve is opened.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Substrate Processing Apparatus

Figure 1:
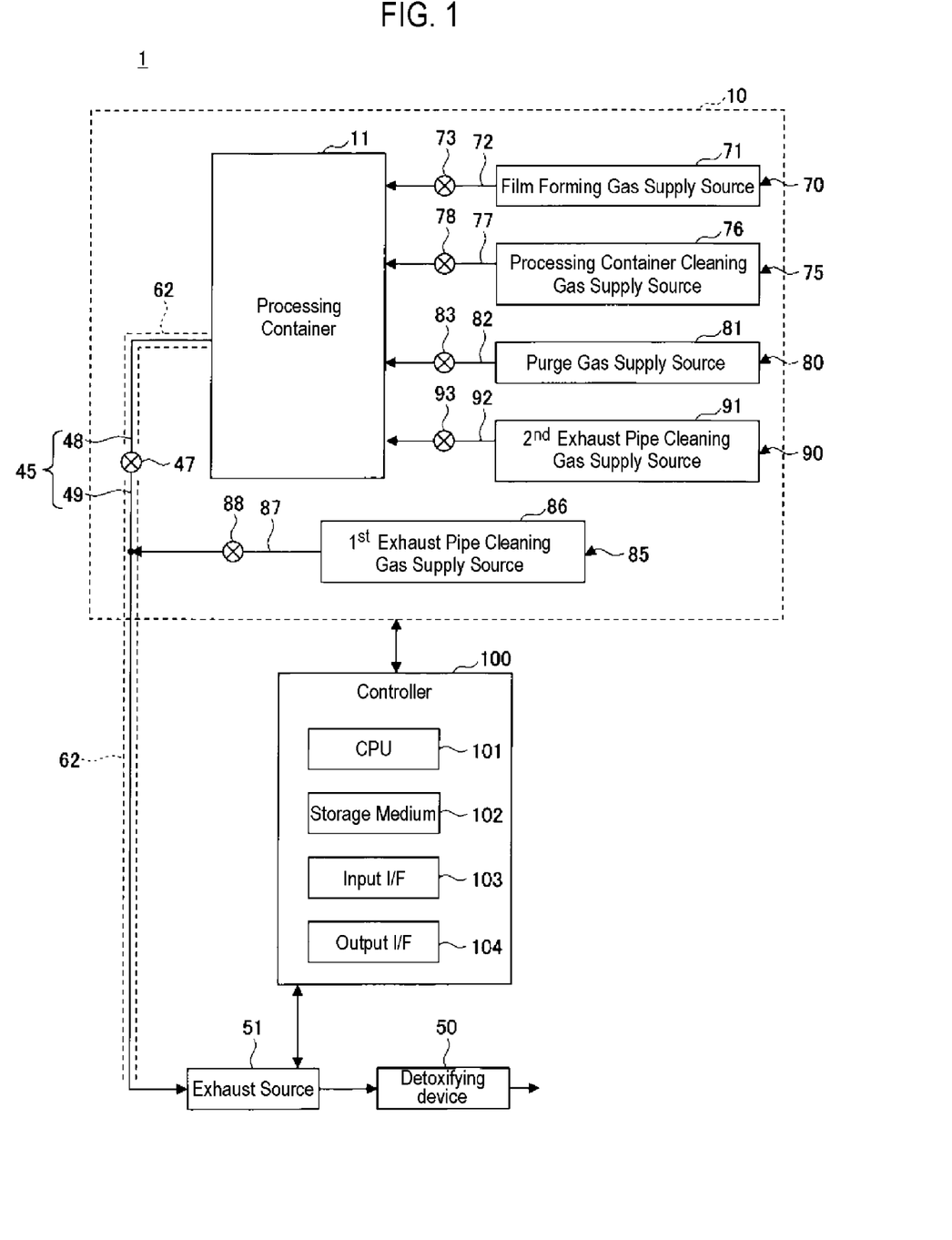
FIG. 1 is a diagram illustrating a substrate processing apparatus according to an embodiment.

FIG. 1 is a diagram illustrating a substrate processing apparatus according to an embodiment. The substrate processing apparatus 1 is a film forming apparatus that forms a film on a substrate. The substrate processing apparatus 1 includes, for example, a processing unit 10, a detoxifying device 50, an exhaust source 51, and a controller 100.

Figure 2:
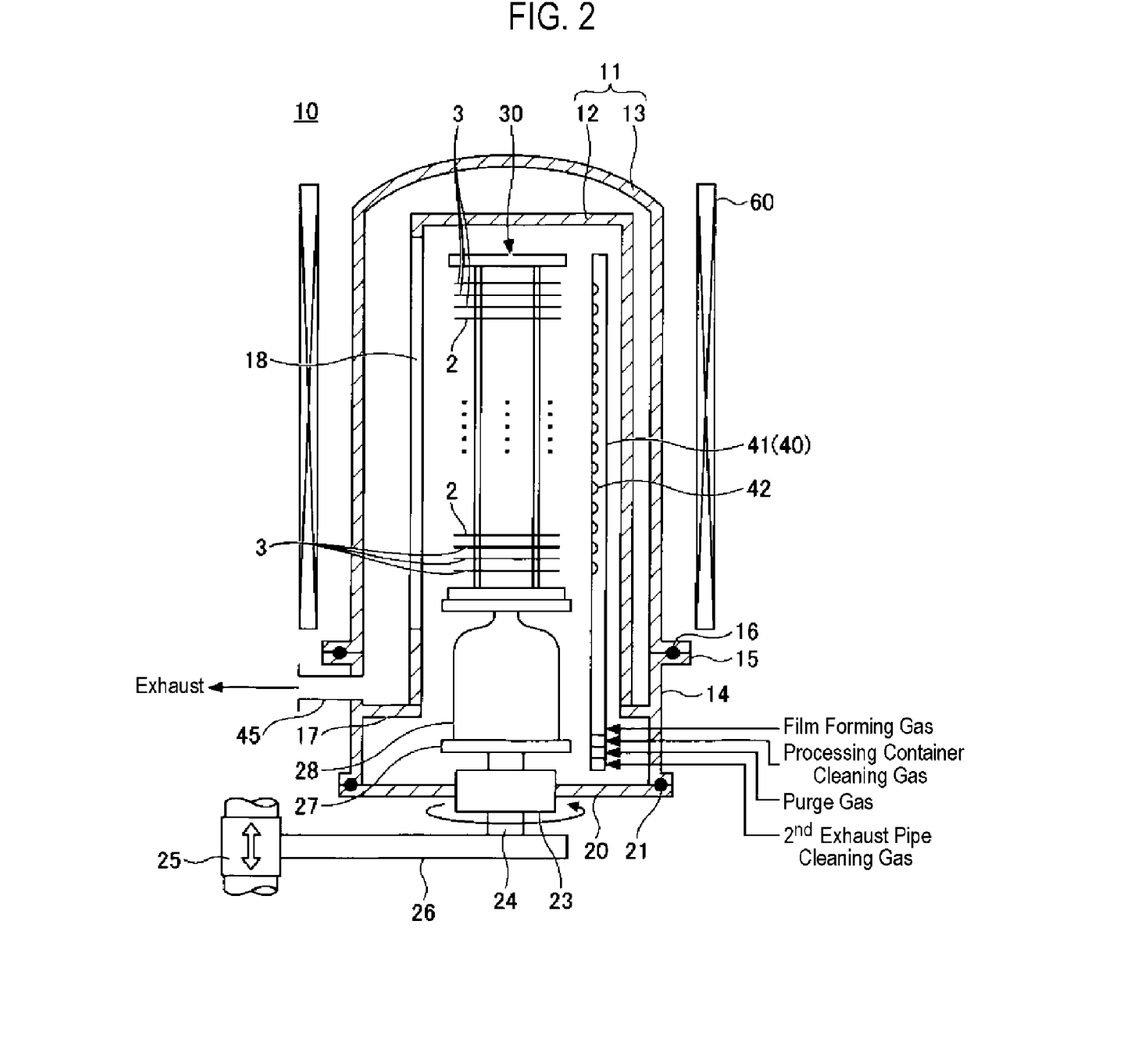
FIG. 2 is a diagram illustrating a processing unit according to an embodiment.

FIG. 2 is a diagram illustrating a processing unit according to an embodiment. The processing unit 10 illustrated in FIG. 2 is a batch-type vertical heat processing device that performs heat processing on a large number of substrates at once. However, the processing unit 10 is not limited to the vertical heat processing device. For example, the processing unit 10 may be a single sheet processing device that processes substrates 2 one by one. In addition, the processing unit 10 may be a semi-batch-type device. The semi-batch-type device rotates a plurality of substrates 2 arranged around the rotation center line of a turntable together with the turntable so as to sequentially send the substrates 2 to a source gas supply area and a reaction gas supply area. In the source gas supply area, a source gas is supplied to the substrates 2. In the reaction gas supply area, a reaction gas is supplied to the substrates 2, and a reaction product of the reaction gas and the source gas is formed on the substrates 2.

As illustrated in FIG. 2, the processing unit 10 includes a processing container 11 that internally forms a space in which the substrates 2 are processed, a lid 20 that hermetically closes an opening in the lower end of the processing container 11, and a substrate holder 30 that holds the substrates 2. The substrates 2 are, for example, semiconductor substrates, and more specifically, for example, silicon wafers. The substrate holder 30 is also called a wafer boat.

The processing container 11 includes a cylindrical inner tube 12 having a ceiling and an opened lower end, and a cylindrical outer tube 13 having a ceiling and an opened lower end and covering the outside of the inner tube 12. The inner tube 12 and the outer tube 13 are coaxially arranged to form a double tube.

The processing container 11 has a cylindrical manifold 14 formed of, for example, stainless steel. A flange portion 15 is formed at the upper end of the manifold 14. The lower end of the outer tube 13 is installed on the flange portion 15. A seal member 16 such as an O-ring is disposed between the flange portion 15 and the lower end of the outer tube 13.

An annular support 17 is installed on the inner wall of the upper portion of the manifold 14. The lower end of the inner tube 12 is installed on the support 17. A lid 20 is hermetically attached to an opening in the lower end of the manifold 14 by a seal member 21 such as an O-ring. The lid 20 is formed of, for example, stainless steel.

A through hole penetrating the lid 20 in a vertical direction is formed in a center portion of the lid 20. A rotary shaft 24 is disposed in the through hole. A gap between the lid 20 and the rotary shaft 24 is sealed by a magnetic fluid seal 23. The lower end of the rotary shaft 24 is rotatably supported by an arm 26 of an elevator 25. A rotary plate 27 is installed at the upper end of the rotary shaft 24. The substrate holder 30 is installed on the rotary plate 27 via a heat insulating table 28.

The substrate holder 30 holds a plurality of substrates 2 at intervals in the vertical direction. Each of the plurality of substrates 2 is held horizontally. The substrate holder 30 holds dummy substrates 3 on both upper and lower sides of a substrate group composed of the plurality of substrates 2. When the elevator 25 is raised, the lid 20 and the substrate holder 30 are raised, the substrate holder 30 is loaded into the processing container 11, and the opening in the lower end of the processing container 11 is hermetically closed by the lid 20. When the elevator 25 is lowered, the lid 20 and the substrate holder 30 are lowered, and the substrate holder 30 is unloaded to the outside of the processing container 11. Further, when the rotary shaft 24 is rotated, the substrate holder 30 is rotated together with the rotary plate 27.

The processing unit 10 has a gas supply pipe 40. The gas supply pipe 40 supplies a gas into the processing container 11. A plurality of gas supply pipes 40 are installed so as to correspond to a plurality of types of gases. The types of gases will be described later. Alternatively, one gas supply pipe 40 may sequentially discharge the plurality of types of gases. In addition, the plurality of gas supply pipes 40 may discharge the same type of gas at the same time.

The gas supply pipe 40 includes, for example, a vertical pipe 41 arranged vertically inside the inner pipe 12 and a horizontal pipe (not illustrated) extending horizontally from the lower end of the vertical pipe 41 and penetrating the manifold 14. The vertical pipe 41 of the gas supply pipe 40 has a plurality of air supply ports 42 spaced apart from each other in the vertical direction. The plurality of air supply ports 42 discharges a gas horizontally.

The processing unit 10 has an exhaust pipe 45. The exhaust pipe 45 exhausts a gas of an inside of the processing container 11. To exhaust a gas of the inside of the inner tube 12, an exhaust port 18 is formed in the inner tube 12. The exhaust port 18 is disposed to face the air supply port 42. The gas discharged horizontally from the air supply port 42 passes through the exhaust port 18, descends along the inner wall of the outer tube 13, and is exhausted from the exhaust pipe 45.

As illustrated in FIG. 1, the exhaust pipe 45 connects the processing container 11 and the detoxifying device 50 and sends the gas exhausted from the processing container 11 to the detoxifying device 50. The detoxifying device 50 removes harmful components from the exhaust gas and then releases the exhaust gas to the atmosphere. In a middle of the exhaust pipe 45, an opening/closing valve 47 and an exhaust source 51 are provided in this order from the upstream side to the downstream side. The opening/closing valve 47 opens and closes the inside of the exhaust pipe 45. The opening/closing valve 47 also serves as a pressure control valve that controls a pressure of an atmosphere inside the processing container 11. The exhaust source 51 includes a vacuum pump and sends the gas to the detoxifying device 50 by suctioning the gas inside the processing container 11.

As illustrated in FIG. 2, the processing unit 10 includes a processing container heater 60. The processing container heater 60 improves the processing capacity of the gas supplied to the inside of the processing container 11 by heating the inside of the processing container 11. The processing container heater 60 is disposed outside the processing container 11 and heats the inside of the processing container 11 from the outside of the processing container 11. For example, the processing container heater 60 is formed in a cylindrical shape so as to surround the outer tube 13. The processing container heater 60 is configured by, for example, an electric heater.

As illustrated in FIG. 1, the processing unit 10 includes an exhaust pipe heater 62. The exhaust pipe heater 62 suppresses liquefaction or solidification of the exhaust gas inside the exhaust pipe 45 by heating the exhaust pipe 45 from the outside. The exhaust pipe heater 62 is disposed along the exhaust pipe 45 and heats both an exhaust pipe upstream portion 48 and an exhaust pipe downstream portion 49. The exhaust pipe upstream portion 48 is a portion on the upstream side of the opening/closing valve 47 in the exhaust pipe 45. The exhaust pipe downstream portion 49 is a portion of the exhaust pipe 45 on the downstream side of the opening/closing valve 47.

As illustrated in FIG. 1, the processing unit 10 includes a film forming gas supply 70, a processing container cleaning gas supply 75, and a purge gas supply 80. The film forming gas supply 70 forms a film on the substrates 2 inside the processing container 11 by supplying a film forming gas into the processing container 11. For example, the film forming gas supply 70 forms a silicon (Si) film by supplying the film forming gas into the processing container 11. The Si film may be either an amorphous silicon film or a polysilicon film. When the Si film is formed, for example, a silane-based gas such as monosilane ($SiH_4$) gas or disilane ($Si_2H_6$) gas is used as the film forming gas.

The film forming gas supply 70 includes a film forming gas supply source 71, a film forming gas pipe 72, and a film forming gas flow rate control valve 73. The film forming gas pipe 72 connects the film forming gas supply source 71 and the gas supply pipe 40 to each other, and sends the film forming gas from the film forming gas supply source 71 to the gas supply pipe 40. The film forming gas flow rate control valve 73 is provided in a middle of the film forming gas pipe 72 and controls the flow rate of the film forming gas.

The processing container cleaning gas supply 75 removes deposits accumulated inside the processing container 11 by supplying a processing container cleaning gas into the processing container 11. This process is performed in a state in which the opening in the processing container 11 is hermetically closed by the lid 20, and is performed in a state in which the substrate holder 30 is loaded into the processing container 11. The processing container cleaning gas removes deposits deposited on the processing container 11, the gas supply pipe 40, and the substrate holder 30. The deposits to be removed are deposits that have been deposited, for example, during formation of films of the substrates 2, and are specifically Si films.

As the processing container cleaning gas, a halogen-containing gas containing a halogen other than fluorine is used. The halogen other than fluorine is, for example, one or more selected from chlorine (Cl), bromine (Br), and iodine (I). It is possible to prevent fluorine from remaining inside the processing container 11 after cleaning the processing container 11. Therefore, when a film forming process of the substrates 2 is performed again inside the processing container 11 after the processing container 11 is cleaned, it is possible to prevent adsorption of fluorine to base surfaces on which the film forming process is performed (e.g., surfaces of the substrates 2 or films formed on the substrates 2) and mixture of fluorine into the films formed by the film forming process.

As the processing container cleaning gas, chlorine ($Cl_2$) gas, for example, is used. The $Cl_2$ gas removes the deposits deposited on the processing container 11, the gas supply pipe 40, and the substrate holder 30. The deposits to be removed are, for example, Si films. The processing container 11, the gas supply pipe 40, and the substrate holder 30 are formed of, for example, quartz ($SiO_2$) or silicon carbide (SiC).

The $Cl_2$ gas selectively etches Si to $SiO_2$ and SiC. Therefore, the $Cl_2$ gas is capable of removing Si films as the deposits while suppressing damage to the processing container 11, the gas supply pipe 40, and the substrate holder 30.

Conventionally, a fluorine-based gas has been used as the processing container cleaning gas. In this case, in addition to the problem in that that fluorine remains in the processing container 11, there is a problem in that it is difficult to form the substrate holder 30 using SiC. This is because SiC is easily etched by the fluorine-based gas.

The processing container cleaning gas of the present embodiment is a halogen-containing gas containing a halogen other than fluorine and does not contain fluorine as a gas constituent element. The phrase "does not contain fluorine as a gas constituent element" includes containing fluorine as an impurity within its meaning. In other words, the processing container cleaning gas may contain fluorine as an impurity. Since the processing container cleaning gas does not contain fluorine as a gas constituent element, it is possible to suppress etching of the substrate holder 30 even if the substrate holder 30 is formed of SiC instead of $SiO_2$.

When the substrate holder 30 is formed of SiC instead of $SiO_2$, it is possible to reduce the difference in thermal expansion between the substrate holder 30 and the substrates 2 which is a silicon wafer, and thus it is possible to suppress generation of particles.

When the substrate holder 30 is formed of SiC instead of $SiO_2$, SiC wafers may be used as the dummy substrates 3. Since it is possible to eliminate the difference in thermal expansion between the dummy substrates 3 and the substrate holder 30, it is possible to suppress generation of particles. In addition, since it is possible to reuse the dummy substrates 3, it is possible to reduce costs compared with, for example, the case in which silicon wafers are used as the dummy substrates 3.

The processing container cleaning gas supply 75 includes a processing container cleaning gas supply source 76, a processing container cleaning gas pipe 77, and a processing container cleaning gas flow rate control valve 78. The processing container cleaning gas pipe 77 connects the processing container cleaning gas supply source 76 and the gas supply pipe 40 to each other, and sends the processing container cleaning gas from the processing container cleaning gas supply source 76 to the gas supply pipe 40. The processing container cleaning gas flow rate control valve 78 is provided in a middle of the processing container cleaning gas pipe 77 and controls the flow rate of the processing container cleaning gas.

The purge gas supply 80 removes the processing container cleaning gas remaining inside the processing container 11 by supplying a purge gas into the processing container 11. This process is performed in the state in which the opening in the processing container 11 is hermetically closed by the lid 20, and is performed in the state in which the substrate holder 30 is loaded into the processing container 11. For example, an inert gas is used as the purge gas. As the inert gas, a rare gas such as Ar gas, $N_2$ gas, or the like may be used.

The purge gas supply 80 includes a purge gas supply source 81, a purge gas pipe 82, and a purge gas flow rate control valve 83. The purge gas pipe 82 connects the purge gas supply source 81 and the gas supply pipe 40 to each other, and sends the purge gas from the purge gas supply source 81 to the gas supply pipe 40. The purge gas flow rate control valve 83 is provided in a middle of the purge gas pipe 82 and controls the flow rate of the purge gas.

The $Cl_2$ gas as the processing container cleaning gas generates $SiCl_4$ gas by etching the Si films deposited inside the processing container 11. The $SiCl_4$ gas is discharged from the processing container 11 together with the $Cl_2$ gas and passes through the exhaust pipe 45. Since a temperature of the exhaust pipe 45 is set to be relatively low to suppress corrosion due to the $Cl_2$ gas, $SiCl_4$ is adsorbed on the inner surface of the exhaust pipe 45. The $SiCl_4$ adsorbate and $H_2O$ gas introduced into the exhaust pipe 45 react to deposit solid-phase $SiOCl_x$.

When the exhaust pipe 45 is opened to the atmosphere in a state in which the solid-phase $SiOCl_x$ is deposited inside the exhaust pipe 45, the solid-phase $SiOCl_x$ reacts with the $H_2O$ gas in the atmosphere and HCl gas is generated as expressed in the following Equation (1).

$$SiOCl_x + H_2O \rightarrow SiO_2 + HCl\uparrow \qquad (1)$$

The generated HCl gas corrodes the exhaust pipe 45 in the presence of $H_2O$ gas. For example, when the exhaust pipe 45 is formed of stainless steel, rust is generated in the exhaust pipe 45. Furthermore, the generated HCl gas is released to the atmosphere without passing through the detoxifying device 50.

Therefore, the processing unit 10 of the present embodiment includes a first exhaust pipe cleaning gas supply 85 and a second exhaust pipe cleaning gas supply 90. Thus, as will be described in detail later, it is possible to remove deposits inside the exhaust pipe 45. The deposits to be removed include, for example, a deposit containing $SiOCl_x$ that is generated in a process of cleaning the inside of the processing container 11.

The first exhaust pipe cleaning gas supply 85 supplies the first exhaust pipe cleaning gas to the exhaust pipe downstream portion 49 on the downstream side of the opening/closing valve 47 in a state in which the opening/closing valve 47 is closed, thereby removing deposits accumulated in the exhaust pipe downstream portion 49. A gas containing fluorine, for example, fluorine ($F_2$) gas, is used as the first exhaust pipe cleaning gas. The $F_2$ gas decomposes solid-phase $SiOCl_x$ as expressed in the following Equation (2).

$$SiOCl_x + F_2 \rightarrow SiF_4\uparrow + O_2\uparrow + Cl_2\uparrow \qquad (2)$$

When the solid-phase $SiOCl_x$ is decomposed by the $F_2$ gas, $SiF_4$ gas, $O_2$ gas, and $Cl_2$ gas are generated. These gases are sent to the detoxifying device 50 by the exhaust source 51. The detoxifying device 50 removes harmful components from the exhaust gas and then releases the exhaust gas to the atmosphere.

Since the first exhaust pipe cleaning gas contains fluorine, the first exhaust pipe cleaning gas is supplied to the exhaust pipe downstream portion 49 on the downstream side of the opening/closing valve 47 in the state in which the opening/closing valve 47 is closed. It is possible to prevent the first exhaust pipe cleaning gas from entering and becoming mixed in the processing container 11 and to prevent fluorine from remaining inside the processing container 11. Therefore, when the film forming process of the substrates 2 is performed again inside the processing container 11, it is possible to prevent adsorption of fluorine to the base surfaces on which the film forming process is performed and entrance and mixing of fluorine into the film formed by the film forming process. Further, the exhaust pipe 45 is set at a relatively low temperature to suppress corrosion due to fluorine. In heating the exhaust pipe 45, the exhaust pipe upstream portion 48 and the exhaust pipe downstream portion 49 can be independently controlled. Therefore, although only the exhaust pipe downstream portion 49 side may be set at a relatively low temperature, the exhaust pipe upstream portion 48 side is also preferably set at a relatively low temperature to prevent a temperature increase due to heat transfer.

The first exhaust pipe cleaning gas supply 85 includes a first exhaust pipe cleaning gas supply source 86, a first exhaust pipe cleaning gas pipe 87, and a first exhaust pipe cleaning gas flow rate control valve 88. The first exhaust pipe cleaning gas pipe 87 connects the first exhaust pipe cleaning gas supply source 86 and the exhaust pipe downstream portion 49, and sends the first exhaust pipe cleaning gas from the first exhaust pipe cleaning gas supply source 86 to the exhaust pipe downstream portion 49. The first exhaust pipe cleaning gas flow rate control valve 88 is provided in a middle of the first exhaust pipe cleaning gas pipe 87 and controls the flow rate of the first exhaust pipe cleaning gas.

The second exhaust pipe cleaning gas supply 90 removes deposits accumulated in the exhaust pipe upstream portion 48 by supplying the second exhaust pipe cleaning gas into the processing container 11. This process is performed in the state in which the opening in the processing container 11 is hermetically closed by the lid 20, and is performed in the state in which the substrate holder 30 is loaded into the processing container 11.

As the second exhaust pipe cleaning gas, a gas not containing fluorine as a gas constituent element is used. The phrase "does not contain fluorine as a gas constituent element" includes containing fluorine as an impurity within its meaning. In other words, the second exhaust pipe cleaning gas may contain fluorine as an impurity.

Since the second exhaust pipe cleaning gas does not contain fluorine as a gas constituent element, it is possible to prevent fluorine from remaining inside the processing container 11. As the second exhaust pipe cleaning gas, for example, a mixed gas of hydrogen ($H_2$) gas and oxygen ($O_2$) gas is used. This mixed gas is thermally excited inside the processing container 11 to generate H radicals and OH radicals, and decomposes solid-phase $SiOCl_x$ as expressed in the following Equation (3).

$$SiOCl_x + H_2 + O_2 \rightarrow HCl\uparrow + SiO_2 \qquad (3)$$

The solid-phase $SiOCl_x$ is decomposed to generate HCl gas and solid-phase $SiO_2$. The HCl gas generated in Equation (3) above is sent to the detoxifying device 50 by the exhaust source 51, so there is no problem. The detoxifying device 50 removes harmful components from the exhaust gas and then releases the exhaust gas to the atmosphere. In addition, unlike the solid-phase $SiOCl_x$, the solid-phase $SiO_2$ generated in Equation (3) above is not problematic because HCl gas is not generated when the exhaust pipe 45 is opened to the atmosphere.

The second exhaust pipe cleaning gas supply 90 includes a second exhaust pipe cleaning gas supply source 91, a second exhaust pipe cleaning gas pipe 92, and a second exhaust pipe cleaning gas flow rate control valve 93. The second exhaust pipe cleaning gas pipe 92 connects the second exhaust pipe cleaning gas supply source 91 and the gas supply pipe 40 to each other, and sends the second exhaust pipe cleaning gas from the second exhaust pipe cleaning gas supply source 91 to the gas supply pipe 40. The second exhaust pipe cleaning gas flow rate control valve 93 is provided in a middle of the second exhaust pipe cleaning gas pipe 92 and controls the flow rate of the second exhaust pipe cleaning gas.

As illustrated in FIG. 1, the substrate processing apparatus 1 includes a controller 100. The controller 100 is configured with, for example, a computer, and includes a central processing unit (CPU) 101 and a storage medium 102 such as memory. In the storage medium 102, a program for controlling various kinds of processes performed in the substrate processing apparatus 1 is stored. The controller 100 controls the operation of the substrate processing apparatus 1 by causing the CPU 101 to execute a program stored in the storage medium 102. The controller 100 includes an input interface 103 and an output interface 104. The controller 100 receives signals from an outside via the input interface 103 and transmits signals to the outside via the output interface 104.

Such a program may be stored in a computer-readable storage medium, and may be installed in the storage medium 102 of the controller 100 from the computer-readable storage medium. The computer-readable storage medium includes, for example, a hard disk (HD), a flexible disk (FD), a compact disk (CD), a magneto optical disk (MO), and a memory card. The program may be downloaded from a server via the Internet and installed in the storage medium 102 of the controller 100.

Operation of Substrate Processing Apparatus

Figure 3:
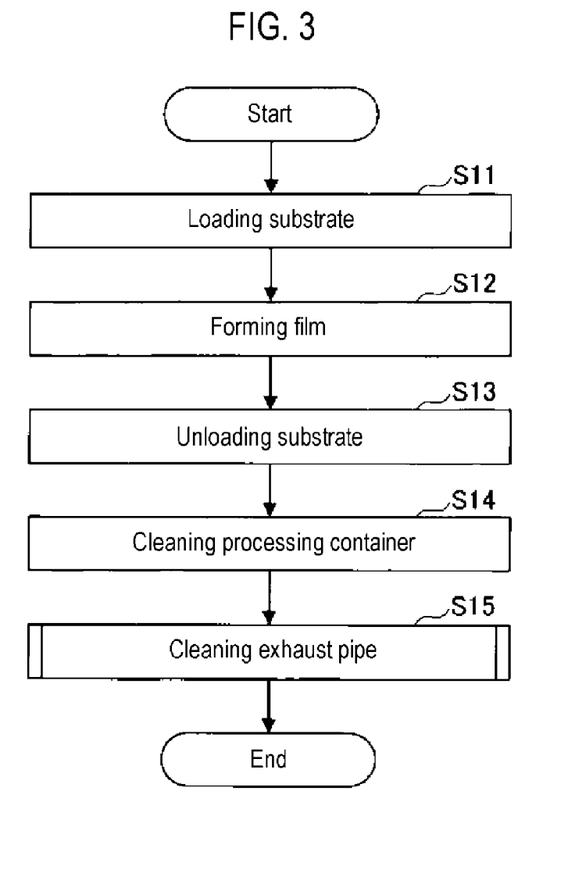
FIG. 3 is a flowchart illustrating the operation of a substrate processing apparatus according to an embodiment.

FIG. 3 is a flowchart illustrating the operation of a substrate processing apparatus according to an embodiment. FIG. 3 illustrates a film forming process of substrates 2 (a loading process S11, a film forming process S12, and an unloading process S13) that is performed prior to a cleaning process (a processing container cleaning process S14 and an exhaust pipe cleaning process S15) of the substrate processing apparatus 1. The processes illustrated in FIG. 3 are repeatedly performed by changing the substrates 2 under the control of the controller 100. In FIG. 3, the cleaning process of the substrate processing apparatus 1 is performed once each time the film forming process of the substrates 2 is performed, but the technology of the present disclosure is not limited thereto. The substrate processing apparatus 1 may be cleaned each time the film forming process of the substrates 2 is performed a plurality of times.

The substrate processing method includes a loading process S11 to load the substrates 2 into the processing container 11. In the loading process S11, first, the transport device places a plurality of substrates 2 on the substrate holder 30 from outside the processing container 11. The substrate holder 30 holds the plurality of substrates 2 horizontally at intervals in the vertical direction. Next, the elevator 25 is raised to raise the lid 20 and the substrate holder 30. The substrates 2 are loaded into the processing container 11 together with the substrate holder 30, and the opening in the lower end of the processing container 11 is hermetically closed by the lid 20.

The substrate processing method includes a film forming process S12 to form a film on the substrates 2. In the film forming process S12, a film is formed on the substrates 2, which are rotated together with the substrate holder 30, by supplying the film forming gas into the processing container 11 while exhausting a gas from the inside of the processing container 11 such that the pressure inside the processing container 11 becomes a set value. The film to be formed is, for example, a Si film. In the film forming process S12, the processing container heater 60 heats the inside of the processing container 11 to increase the film forming speed. After the film forming process S12, a purge gas is supplied instead of the film forming gas, the exhausting of the gas from the inside of the processing container 11 is stopped, and then the pressure inside the processing container 11 is returned to an atmospheric pressure.

The substrate processing method includes an unloading process S13 for unloading the substrates 2 to the outside of the processing container 11. In the unloading process S13, the elevator 25 is lowered, and the lid 20 and the substrate holder 30 are lowered. The lid 20 opens the opening in the lower end of the processing container 11, and the substrates 2 are unloaded to the outside of the processing container 11 together with the substrate holder 30. Then, the transport device removes the substrates 2 from the substrate holder 30. The lid 20 and the substrate holder 30 are raised. The substrate holder 30 is loaded into the processing container 11, and the opening in the lower end of the processing container 11 is hermetically closed by the lid 20.

The substrate processing method includes a processing container cleaning process S14 to clean the inside of the processing container 11. In the processing container cleaning process S14, the inside of the processing container 11 is dry-cleaned. In the processing container cleaning process S14, a processing container cleaning gas is supplied to the inside of the processing container 11 while a gas of the inside of the processing container 11 is exhausted such that the pressure inside the processing container 11 becomes a set value. The processing container cleaning gas is, for example, $Cl_2$ gas. The $Cl_2$ gas can remove Si films as the deposits while suppressing damage to the processing container 11, the gas supply pipe 40, and the substrate holder 30. Since the conventional fluorine-based gas easily etches SiC, when the substrate holder 30 is formed of SiC, using $Cl_2$ gas instead of the conventional fluorine-based gas is significant.

The substrate processing method includes an exhaust pipe cleaning process S15 for cleaning the inside of the exhaust pipe 45. In the exhaust pipe cleaning process S15, the inside of the exhaust pipe 45 is dry-cleaned. In the exhaust pipe cleaning process S15, the deposits deposited in the exhaust pipe 45 in the processing container cleaning process S14 are removed. The deposits to be removed are, for example, solid-phase $SiOCl_x$. The solid-phase $SiOCl_x$ may be deposited inside the exhaust pipe 45 in a process other than the processing container cleaning process S14. In a case where the deposits deposited in the exhaust pipe 45 are removed in the processing container cleaning process S14, the exhaust pipe cleaning process S15 is performed after the processing container cleaning process S14. Although it is desirable to perform the exhaust pipe cleaning process S15 whenever the processing container cleaning process S14 is performed, the exhaust pipe cleaning process S15 may also be performed after the processing container cleaning process S14 is performed multiple times.

Figure 4:
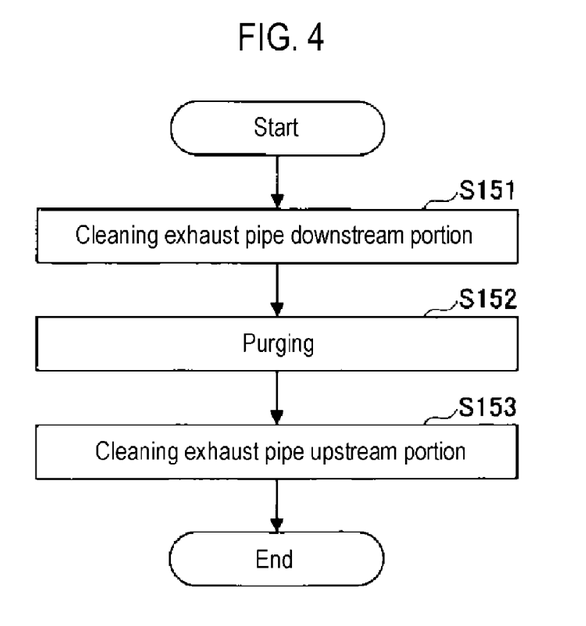
FIG. 4 is a flowchart illustrating an exhaust pipe cleaning process according to an embodiment.

FIG. 4 is a flowchart illustrating an exhaust pipe cleaning process according to an embodiment. The exhaust pipe cleaning process S15 includes an exhaust pipe downstream portion cleaning process S151 to clean the exhaust pipe downstream portion 49. In the exhaust pipe downstream portion cleaning process S151, the first exhaust pipe cleaning gas is supplied to the exhaust pipe downstream portion 49 on the downstream side of the opening/closing valve 47 in the state in which the opening/closing valve 47 is closed. The opening/closing valve 47 is switched from the opened state to the closed state after the processing container cleaning process S14 and before the exhaust pipe downstream portion cleaning process S151. In addition, before the opening/closing valve 47 is switched from the opened state to the closed state, the supply of $Cl_2$ gas to the inside of the processing container 11 is stopped, and vacuuming or purging is performed.

The first exhaust pipe cleaning gas is, for example, $F_2$ gas. The $F_2$ gas decomposes solid-phase $SiOCl_x$ as expressed in Equation (2) above. When the solid-phase $SiOCl_x$ is decomposed by the $F_2$ gas, $SiF_4$ gas, $O_2$ gas, and $Cl_2$ gas are generated. Since these gases are sent to the detoxifying device 50 by the exhaust source 51, there is no problem. The detoxifying device 50 removes harmful components from the exhaust gas and then releases the exhaust gas to the atmosphere.

In the exhaust pipe downstream portion cleaning process S151, since the opening/closing valve 47 is closed, the $F_2$ gas does not enter and become mixed in the processing container 11, which is positioned in the upstream side of the opening/closing valve 47. By the exhaust pipe downstream portion cleaning process S151, it is possible to prevent fluorine from remaining inside the processing container 11. Therefore, when the film forming process of the substrates 2 is performed again inside the processing container 11, it is possible to prevent adsorption of fluorine to the base surfaces on which the film forming process is performed and entrance and mixing of fluorine into the film formed by the film forming process.

Since the opening/closing valve 47 is closed in the exhaust pipe downstream portion cleaning process S151, the inside of the processing container 11 is maintained in the same state as when the processing container cleaning process S14 is completed. When the processing container cleaning process S14 is completed, the $Cl_2$ gas used in the processing container cleaning process S14 is adsorbed on the inner surface of the processing container 11, and thus the $Cl_2$ gas remains. The remaining $Cl_2$ gas is removed in a purge process S152 described below.

The exhaust pipe cleaning process S15 has a purge process S152 to supply a purge gas into the processing container 11 in a state in which the opening/closing valve 47 is opened. The remaining $Cl_2$ gas is discharged from the processing container 11 to the exhaust pipe 45 together with the purge gas. The supply of $F_2$ gas to the exhaust pipe downstream portion 49 is stopped after the exhaust pipe downstream portion cleaning process S151 and before the purge process S152, and then the opening/closing valve 47 is switched from the closed state to the open state.

During the purge process S152, the processing container heater 60 raises a temperature of the processing container 11 to a set temperature and maintains the temperature at the set temperature, thereby improving the discharge efficiency of the remaining $Cl_2$ gas adsorbed on the inner surface of the processing container 11. In addition, during the purge process S152, the exhaust pipe heater 62 raises the temperature of the exhaust pipe 45 to a set temperature and maintains the temperature at the set temperature, thereby promoting desorption of the first exhaust pipe cleaning gas or decomposed deposits adsorbed on the inner surface of the exhaust pipe 45 and suppressing liquefaction or solidification of the exhaust gas.

In the processing container cleaning process S14 and the exhaust pipe downstream portion cleaning process S151, unlike the purge process S152 and the exhaust pipe upstream portion cleaning process S153 to be described later, a gas containing a halogen element is used. To prevent corrosion of the exhaust pipe 45 due to the halogen element, the temperature of the exhaust pipe 45 is set to be relatively low in the processing container cleaning process S14 and the exhaust pipe downstream portion cleaning process S151.

The exhaust pipe cleaning process S15 includes an exhaust pipe upstream portion cleaning process S153 to clean the exhaust pipe upstream portion 48. In the exhaust pipe upstream portion cleaning process S153, the second exhaust pipe cleaning gas is supplied into the processing container 11 in the state in which the opening/closing valve 47 is opened. Since a gas not containing a halogen element and fluorine is used as the second exhaust pipe cleaning gas, the temperature of the exhaust pipe 45 may be set to be relatively high.

The second exhaust pipe cleaning gas is, for example, a mixed gas of $H_2$ gas and $O_2$ gas. The mixed gas is thermally excited inside the processing container 11 to generate H radicals and OH radicals, and decomposes solid-phase SiOCl$_x$ as expressed in Equation (3) above. The solid-phase SiOCl$_x$ is decomposed to generate HCl gas and solid-phase SiO$_2$. The HCl gas generated in Equation (3) above is sent to the detoxifying device 50 by the exhaust source 51, and thus there is no problem. The detoxifying device 50 removes harmful components from the exhaust gas and then releases the exhaust gas to the atmosphere. In addition, unlike the solid-phase SiOCl$_x$, the solid-phase SiO$_2$ generated in Equation (3) above is not problematic because the solid-phase SiO$_2$ does not generate HCl gas when the exhaust pipe 45 is opened to the atmosphere.

The processing conditions when the mixed gas of $H_2$ gas and $O_2$ gas is used as the second exhaust pipe gas are as follows. The temperature of the processing container 11 is, for example, 300 degrees C. or higher and 900 degrees C. or lower. The temperature of the exhaust pipe 45 is, for example, room temperature or higher and 300 degrees C. or lower. To promote the reaction between the deposits and the cleaning gas and to suppress liquefaction or solidification of the exhaust gas, it is desirable to set the temperatures to be high. The supply flow rate of $H_2$ gas into the processing container 11 is, for example, 500 sccm or more and 2,000 sccm or less. The supply flow rate of $O_2$ gas into the processing container 11 is, for example, 500 sccm or more and 2,000 sccm or less. The pressure inside the processing container 11 is, for example, 0.1 Torr or higher and 5 Torr or lower.

The order of the exhaust pipe downstream portion cleaning process S151 and the exhaust pipe upstream portion cleaning process S153 may be opposite the order illustrated in FIG. 4, but in the present embodiment, as illustrated in FIG. 4, the exhaust pipe upstream portion cleaning process S153 is performed after the exhaust pipe downstream portion cleaning process S151 is performed. In this manner, as described in detail later, it is possible to shorten the waiting time for a temperature change of the exhaust pipe 45 and thus shorten the time of the exhaust pipe cleaning process S15.

Figure 5:
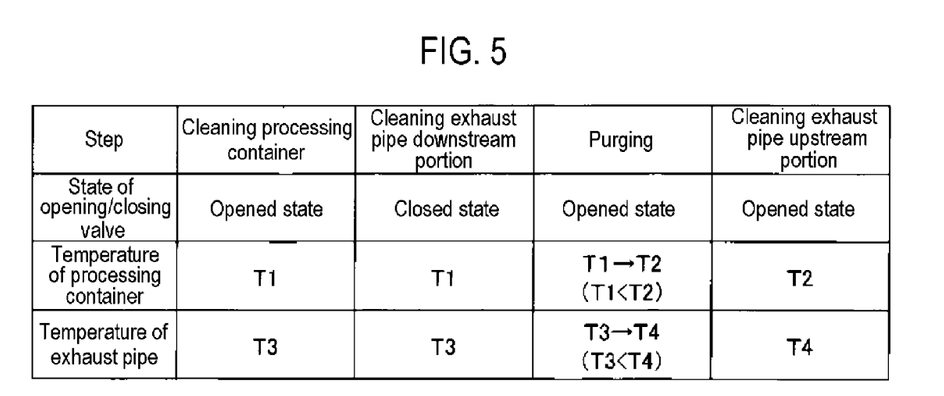
FIG. 5 is a diagram illustrating cleaning conditions of a substrate processing apparatus according to an embodiment.

According to the present embodiment, as described above, the exhaust pipe cleaning process S15 is performed after the processing container cleaning process S14. In the exhaust pipe cleaning process S15, the exhaust pipe downstream portion cleaning process S151, the purge process S152, and the exhaust pipe upstream portion cleaning process S153 are performed in this order. In this manner, as illustrated in FIG. 5, processes in which the temperature of the exhaust pipe 45 is relatively low may be performed collectively before a process in which the temperature of the exhaust pipe 45 is relatively high. In addition, the processes in which the temperature of the processing container 11 is relatively low may be collectively performed before a process in which the temperature of the processing container 11 is relatively high. FIG. 5 is a diagram showing cleaning conditions of a substrate processing apparatus according to an embodiment.

In the processing container cleaning process S14 and the exhaust pipe downstream portion cleaning process S151, unlike the purge process S152 and the exhaust pipe upstream portion cleaning process S153, a gas containing a halogen element is used. Thus, to prevent corrosion of the exhaust pipe 45 due to the halogen element, as illustrated in FIG. 5, the temperature of the exhaust pipe 45 is set to be relatively low in the processing container cleaning process S14 and the exhaust pipe downstream portion cleaning process S151. By continuously performing the processing container cleaning process S14 and the exhaust pipe downstream portion cleaning process S151, in which the temperature of the exhaust pipe 45 is relatively low, it is possible to reduce the number of times the temperature of the exhaust pipe 45 is changed compared with the case in which the exhaust pipe upstream portion cleaning process S153 is performed between these processes. Thus, it is possible to shorten the waiting time for the temperature change of the exhaust pipe 45, and thus shorten the time of the exhaust pipe cleaning process S15.

In addition, although the temperature of the exhaust pipe 45 in the processing container cleaning process S14 and the temperature of the exhaust pipe 45 in the exhaust pipe downstream portion cleaning process S151 are the same in FIG. 5, they may also be different from each other. Furthermore, the temperature of the exhaust pipe 45 at the time of terminating the purge process S152 and the temperature of the exhaust pipe 45 in the exhaust pipe upstream portion cleaning process S153 are the same in FIG. 5, but they may also be different from each other. In any case, by continuously performing the processing container cleaning process S14 and the exhaust pipe downstream portion cleaning process S151 in which the temperature of the exhaust pipe 45 is relatively low, the temperature of the exhaust pipe 45 may not be unnecessarily increased and decreased within the same temperature range. Thus, it is possible to shorten the waiting time for the temperature change of the exhaust pipe 45, and thus shorten the time of the exhaust pipe cleaning process S15.

In addition, in the processing container cleaning process S14 and the exhaust pipe downstream portion cleaning process S151, the temperature of the processing container 11 is set to be relatively lower compared with the purge process S152 and the exhaust pipe upstream portion cleaning process S153. In the purge process S152, the temperature of the processing container 11 is set to be relatively high to improve the discharge efficiency of the $Cl_2$ gas remaining inside the processing container 11. Further, in the exhaust pipe upstream portion cleaning process S153, the temperature of the processing container 11 is set to be relatively high to thermally excite the mixed gas of H₂ gas and O₂ gas. According to the present embodiment, by continuously performing the processing container cleaning process S14 and the exhaust pipe downstream portion cleaning process S151 in which the temperature of the processing container 11 is relatively low, it is possible to reduce the number of times the temperature of the processing container 11 is changed compared with the case in which the exhaust pipe upstream portion cleaning process S153 is performed between these processes. Thus, it is possible to shorten the waiting time for the temperature change of the processing container 11, and thus shorten the time of the exhaust pipe cleaning process S15.

In addition, although the temperature of the processing container 11 in the processing container cleaning process S14 and the temperature of the processing container 11 in the exhaust pipe downstream portion cleaning process S151 are the same in FIG. 5, they may also be different from each other. Furthermore, the temperature of the processing container 11 at the time of terminating the purge process S152 and the temperature of the processing container 11 in the exhaust pipe upstream portion cleaning process S153 are the same in FIG. 5, but they may also be different from each other. In any case, by continuously performing the processing container cleaning process S14 and the exhaust pipe downstream portion cleaning process S151 in which the temperature of the processing container 11 is relatively low, the temperature of the processing container 11 may not be unnecessarily increased and decreased within the same temperature range. Thus, it is possible to shorten the waiting time for the temperature change of the processing container 11, and thus shorten the time of the exhaust pipe cleaning process S15.

Although the embodiments of a cleaning method of the substrate processing apparatus and the substrate processing apparatus according to the present disclosure have been described above, the present disclosure is not limited to the above-described embodiments. Various changes, modifications, substitutions, additions, deletions, and combinations may be made within the scope of the claims. These also belong to the technical scope of the present disclosure.

For example, the film formed using the film forming gas is not limited to the Si film. For example, a germanium (Ge) film or a silicon germanium (SiGe) film may be formed instead of the Si film. In the case of forming the Ge film, a germane-based gas such as a monogermane (GeH₄) gas or a digermane (Ge₂H₆) gas is used as the film forming gas. When forming the SiGe film, for example, a silane-based gas or a germane-based gas is used as the film forming gas. The Si film, Ge film, and SiGe film may be non-doped films or films doped with carbon (C), phosphorus (P), boron (B), or the like.

The processing container cleaning gas is not limited to Cl₂ gas. As the processing container cleaning gas, hydrogen chloride (HCl) gas, bromine (Br₂) gas, hydrogen bromide (HBr) gas, hydrogen iodide (HI) gas or the like may be used in addition to the Cl₂ gas. Since these gases do not contain fluorine, it is possible to prevent fluorine from remaining inside the processing container 11.

The first exhaust pipe cleaning gas is not limited to F₂ gas. As the first exhaust pipe cleaning gas, a fluorine-based gas such as chlorine trifluoride (ClF₃) gas may be used in addition to the F₂ gas. The fluorine-based gas can decompose the solid-phase SiOCl$_x$ like the F₂ gas.

Deposits decomposed by F₂ gas, ClF₃ gas, or the like may contain at least one of Si or Ge derived from the film forming gas, and may be a compound containing at least one of Cl, Br, or I derived from the processing container cleaning gas. The deposits may be decomposed by a reaction equation similar to Equation (3) above.

The second exhaust pipe cleaning gas is not limited to the mixed gas of H₂ gas and O₂ gas. As the second exhaust pipe cleaning gas, ammonia (NH₃) gas, oxygen (O₂) gas or the like may be used in addition to the mixed gas of H₂ gas and O₂ gas.

For example, NH₃ gas as the second exhaust pipe gas decomposes solid-phase SiOCl$_x$ as expressed in the following Equation (4).

$$SiOCl_x + NH_3 \rightarrow NH_4Cl\uparrow + SiON \quad (4)$$

The solid-phase SiOCl$_x$ is decomposed to generate NH₄Cl gas and solid-phase SiON. The NH₄Cl gas generated in Equation (4) above is sent to the detoxifying device 50 by the exhaust source 51, and thus there is no problem. The detoxifying device 50 removes harmful components from the exhaust gas and then releases the exhaust gas to the atmosphere. Unlike the solid-phase SiOCl$_x$, the solid-phase SiON generated in Equation (4) above is not problematic because the solid-phase SiON does not generate HCl gas when the exhaust pipe 45 is opened to the atmosphere.

In addition, deposits decomposed by NH₃ gas as the second exhaust pipe gas contain at least one of Si or Ge derived from the film forming gas, and may be a compound containing at least one of Cl, Br, or I derived from the processing container cleaning gas. The deposits may be decomposed by a reaction equation similar to Equation (4) above.

The processing conditions when the NH₃ gas is used as the second exhaust pipe gas are as follows. The temperature of the processing container 11 is, for example, 300 degrees C. or higher and 900 degrees C. or lower. The temperature of the exhaust pipe 45 is, for example, room temperature or higher and 300 degrees C. or lower. The supply flow rate of NH₃ gas into the processing container 11 is, for example, 500 sccm or more and 5,000 sccm or less. The pressure inside the processing container 11 is, for example, 0.1 Torr or higher and 300 Torr or lower.

In addition, the O₂ gas as the second exhaust pipe gas decomposes solid-phase SiOCl$_x$ as expressed in the following Equation (5).

$$SiOCl_x + O_2 \rightarrow Cl_2\uparrow + SiO_2 \quad (5)$$

The solid-phase SiOCl is decomposed to generate Cl₂ gas and solid-phase SiO₂. The Cl₂ gas generated in Equation (5) above is sent to the detoxifying device 50 by the exhaust source 51, and thus there is no problem. The detoxifying device 50 removes harmful components from the exhaust gas and then releases the exhaust gas to the atmosphere. Unlike the solid-phase SiOCl$_x$, the solid-phase SiO₂ generated in Equation (5) above is not problematic because the solid-phase SiO₂ does not generate HCl gas when the exhaust pipe 45 is opened to the atmosphere.

In addition, deposits decomposed by O₂ gas as the second exhaust pipe gas contain at least one of Si or Ge derived from the film forming gas, and may be a compound containing at least one of Cl, Br, or I derived from the processing container cleaning gas. The deposits may be decomposed by a reaction equation similar to Equation (5) above.

The processing conditions when the O₂ gas is used as the second exhaust pipe gas are as follows. The temperature of the processing container 11 is, for example, room temperature or higher and 900 degrees C. or lower. The temperature of the exhaust pipe 45 is, for example, room temperature or higher and 300 degrees C. or lower. The supply flow rate of $O_2$ gas into the processing container 11 is, for example, 10 sccm or more and 50,000 sccm or less. The atmospheric pressure inside the processing container 11 is, for example, 0.1 Torr or higher and an atmospheric pressure (760 Torr) or lower.

The substrate 2 is not limited to a semiconductor substrate such as a silicon wafer, but may be a glass substrate or the like.

According to an embodiment of the present disclosure, it is possible to suppress corrosion of the exhaust pipe when the exhaust pipe is opened to the atmosphere, and to suppress fluorine from remaining inside the processing container.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A cleaning method of a substrate processing apparatus, the method comprising:
   cleaning an inside of an exhaust pipe through which a gas of an inside of a processing container is exhausted,
   wherein cleaning the inside of the exhaust pipe includes:
   removing a deposit on a downstream side of an opening/closing valve in the exhaust pipe by supplying a first exhaust pipe cleaning gas containing fluorine to the downstream side of the opening/closing valve in the exhaust pipe in a state in which the opening/closing valve provided in a middle of the exhaust pipe is closed; and
   removing a deposit on an upstream side of the opening/closing valve in the exhaust pipe by supplying a second exhaust pipe cleaning gas not containing fluorine as a gas constituent element to the inside of the processing container in a state in which the opening/closing valve is opened.

2. The method of claim 1, further comprising cleaning the inside of the processing container by supplying a processing container cleaning gas containing a halogen other than fluorine as a gas constituent element to the inside of the processing container,
   wherein cleaning the inside of the exhaust pipe includes removing the deposits deposited inside the exhaust pipe in cleaning the inside of the processing container.

3. The method of claim 1, wherein the deposits that are removed by cleaning of the exhaust pipe are a compound containing at least one of silicon or germanium, and a halogen other than fluorine.

4. The method of claim 1, wherein the second exhaust pipe cleaning gas is at least one selected from a mixed gas of hydrogen gas and oxygen gas, ammonia gas, and oxygen gas.

5. The method of claim 2, wherein removing the deposit on the downstream side of the opening/closing valve in the exhaust pipe by the first exhaust pipe cleaning gas is performed after cleaning the inside of the processing container, and then removing the deposit on the upstream side of the opening/closing valve in the exhaust pipe by the second exhaust pipe cleaning gas is performed.

6. The method of claim 5, wherein a temperature of the exhaust pipe in removing the deposit on the downstream side of the opening/closing valve in the exhaust pipe by the first exhaust pipe cleaning gas is lower than a temperature of the exhaust pipe in removing the deposit on the upstream side of the opening/closing valve in the exhaust pipe by the second exhaust pipe cleaning gas.

7. The method of claim 5, wherein a temperature of the processing container in removing the deposit on the downstream side of the opening/closing valve in the exhaust pipe by the first exhaust pipe cleaning gas is lower than a temperature of the processing container in removing the deposit on the upstream side of the opening/closing valve in the exhaust pipe by the second exhaust pipe cleaning gas.

* * * * *